(12) United States Patent
Wagh et al.

(10) Patent No.: US 6,614,323 B2
(45) Date of Patent: Sep. 2, 2003

(54) MODULATED RF PULSE WAVEFORM GENERATION METHOD AND DEVICE

(75) Inventors: Poojan A. Wagh, Sleepy Hollow, IL (US); Pallab Midya, Palatine, IL (US); Patrick Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 49 days.

(21) Appl. No.: 09/995,305

(22) Filed: Nov. 27, 2001

(65) Prior Publication Data

US 2003/0098754 A1 May 29, 2003

(51) Int. Cl.[7] .................................................. H03K 7/00
(52) U.S. Cl. ...................................... 332/106; 332/103
(58) Field of Search ............................... 332/106, 103; 375/296, 298; 329/304, 305

(56) References Cited

U.S. PATENT DOCUMENTS 5,473,280 A * 12/1995 Ohnishi et al. ............. 329/304
5,805,640 A * 9/1998 O'Dea et al. ................ 375/296
5,838,210 A 11/1998 Midya et al.

OTHER PUBLICATIONS

"Integral Noise Shaping for Quantization of Pulse Width Modulation": Pallab Midya & Matt Miller; Motorola Labs, Schaumburg, Illinois and Mark Sandler, Kings College, London. An audio engineering society preprint, presented at the 109th Convention Sep. 22–25, 2000 in Los Angeles, California, USA.

"Prediction Correction Algorith for Natural Pulse Width Modulation": Pallab Midya, Bill Roeckner, Pat Rakers, & Poojan Wagh; Motorola Labs, Schaumburg, Illinois. An audio engineering society preprint, presented at the 109th Convention Sep. 22–25, 2000 in Los Angeles, California, USA.

"Theory and Implementation of a New Type of Digital Power Amplifiers for Audio Applications": Martin Streitenberger, Helmut Bresch, & Wolfgang Mathis; Otto Von Guericke University Madgedburg. Presented at IEEE International Symposium on Circuits and Systems, May 28–31, 2000 in Geneva, Switzerland.

"Click Modulation": B.F. Logan, Jr.; Mar. 1984 AT&T Bell Laboratories.

"Theory of Analytic Modulation Systems": B.F Logan, Jr.; AT&T. Published in The Bell System Technical Journal on Mar. 1978.

* cited by examiner

Primary Examiner—Robert Pascal
Assistant Examiner—Joseph Chang
(74) Attorney, Agent, or Firm—Kenneth A. Haas

(57) ABSTRACT

A device for implementing a method for receiving a complex baseband signal in analog form or in digital form, and providing a pulse modulated signal as a linear modulation of the complex baseband signal is disclosed. First, a complex modulated signal as a function of the complex baseband signal is generated. Second, a bandlimited exponential signal as a function of the complex modulated signal as computed with a truncated Taylor series for an exponential is generated, or a coefficient vector as a function of the complex modulated signal is generated. Finally, a pulse modulated signal as either a function of the bandlimited exponential signal or the coefficient vector is generated.

13 Claims, 3 Drawing Sheets

US 6,614,323 B2

MODULATED RF PULSE WAVEFORM GENERATION METHOD AND DEVICE

FIELD OF THE INVENTION

In general, the present invention relates to the field of communication systems. More specifically, the present invention relates to the generation of a modulated radio frequency ("RF") pulse waveform.

BACKGROUND OF THE INVENTION

U.S. Pat. No. 5,838,210 is directed toward an efficient generation of wideband pulse modulated signals from quadrature baseband signals. However, U.S. Pat. No. 5,838, 210 discloses an analog based apparatus for generating the wideband pulse modulated signals whereby a considerable in-band distortion can occur (i.e., there is a failure to achieve linear modulation). Thus, the current movement is toward digital based apparatuses having minimal any in-band distortion. Click modulation as known in the art is a method for generating wideband pulse modulated waves without distortion based upon an employment of an ideal filter. However, a drawback of prior art click modulation is a failure to implement an ideal filter which necessitates an employment of a complex filter in order to suppress distortion to acceptable levels (i.e., there is a failure to achieve linear modulation).

Thus, there is a need for an efficient and simple transmitter for generating RF pulse signals without the need for a complex filter.

SUMMARY OF THE INVENTION

One form of the present invention is a method comprising a reception of a complex baseband signal; and a generation of a pulse modulated signal in response to a reception of the complex baseband signal where the pulse modulated signal is a linear modulation of the complex baseband signal.

A second form of the present invention is a method comprising a reception of a complex baseband signal in analog form; a generation of a complex modulated signal in response to a reception of the complex baseband signal where the complex modulated signal is a function of the complex baseband signal; a generation of a first bandlimited exponential signal in response to a generation of the complex modulated signal where the first bandlimited exponential is a function of the complex modulated signal as computed with a first truncated series for an exponential; and a generation of a pulse modulated signal in response to a generation of the first bandlimited exponential signal where the pulse modulated signal is a function of the first bandlimited exponential signal.

A third form of the present invention is a method comprising a reception of a complex baseband signal in digital form; a generation of a first complex modulated signal in response to a reception of the complex baseband signal where the first complex modulated signal is a function of the complex baseband signal; a generation of a first coefficient vector in response to a generation of the complex baseband signal where the first coefficient vector is a function of the first complex modulated signal; and a generation of a pulse modulated signal in response to a generation of the first coefficient vector signal where the pulse modulated signal is a function of the first coefficient vector signal.

Additional forms of the present invention include devices for implementing the aforementioned methods.

The foregoing forms and other forms, features and advantages of the present invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENTS

Figure 1:
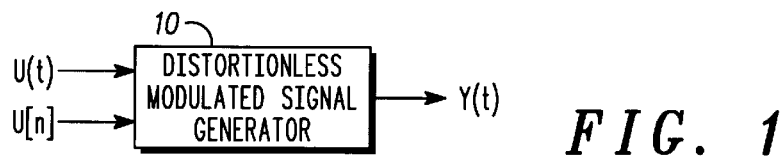
FIG. 1 illustrates a distortionless pulse modulated signal generator in accordance with the present invention.

In FIG. 1, a distortionless pulse modulated signal generator 10 (hereinafter "the signal generator 10") in accordance with the present invention is shown. The signal generator 10 receives a complex baseband signal in analog form u(t) or in digital form u[n]. The complex baseband signal equals I+jQ where I is a baseband in-phase signal, j is a square root of −1, and Q is baseband quadrature signal. In response thereto, the signal generator 10 generate and provides a pulse modulated signal y(t) composed of the complex valued signal mixed up to a carrier frequency $_c$ and switching harmonics which do not interfere with a desired band around the carrier frequency $_c$. Thus, the pulse modulated signal y(t) represents a linear modulation (i.e., an omission of distortion in the band of interest) of the complex baseband signal in the form of a switching signal. The signal generator 10, as will be appreciated by those having ordinary skill in the art from the subsequent description herein of various embodiments thereof, can be employed within various communications systems, devices and test equipment, such as, for example, subscriber products (e.g., handsets), infrastructure products (e.g., basestations), software radio, and/or cable data modems.

Figure 2:
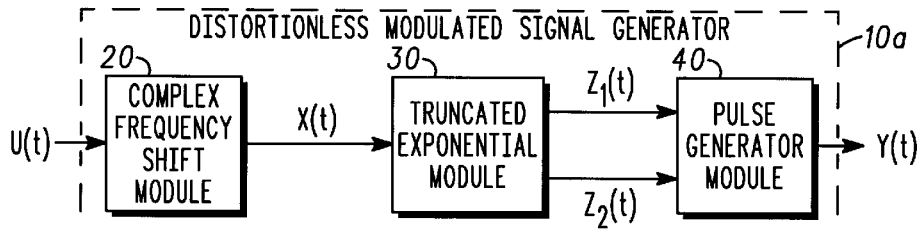
FIG. 2 illustrates a first embodiment of the distortionless pulse modulated signal generator of FIG. 1.
Figure 3:
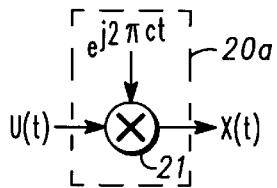
FIG. 3 illustrates a first embodiment of a complex frequency shift module in accordance with the present invention.

In FIG. 2, a first embodiment 10a of the signal generator 10 is shown. In the illustrated embodiment 10a, a complex frequency shift module 20 receives the complex baseband signal in analog form u(t), and in response thereto, generate and provides a complex modulated signal x(t). In one embodiment 20a as shown in FIG. 3, a mixer 21 generates-and provides the complex modulated signal x(t) in accordance with the following equation [1]:

$$x(t) = u(t) e^{j2\pi f_c t} \quad [1]$$

Referring again to FIG. 2, the theory behind click modulation states that the complex modulated signal x(t) must be exponentiated, low-pass filtered, and de-exponentiated. The theory calls for an ideal low-pass filter. In practice, an ideal-low pass filter cannot be built and deviation from the ideal results in nonlinearity (i.e. distortion in the output). In order to suppress this distortion to acceptable levels, a filter of great complexity is necessary. In an analog and a digital implementation, such a filter is prohibitive in that it dissipates large amounts of power and requires more circuit area and cost. In an analog implementation, such a filter is sensitive to device variation and environmental factors (i.e. temperature). In a digital implementation, such a filter requires sample rates much greater than the RF carrier frequency, which prohibits the realization of the prior art system. Furthermore, any filter realized will present some distortion at the output of the system. In the method taught in the present invention, an ideal result of exponentiating and low-pass filtering is obtained without the use of a filter. Without the filtering requirements, a low-cost, low-complexity analog or digital system can be realized. Furthermore, the method of the present invention will exhibit no distortion as opposed to the prior art method, which will exhibit distortion. A result of exponentiating and ideal low-pass filtering the complex modulated signal x(t) is denoted $z_1(t)$ and $z_2(t)$. However, no filtering is necessary to obtain such a result.

Figure 4A:
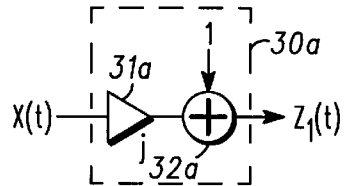
FIG. 4A illustrates a first embodiment of a truncated exponential module in accordance with the present invention.
Figure 4B:
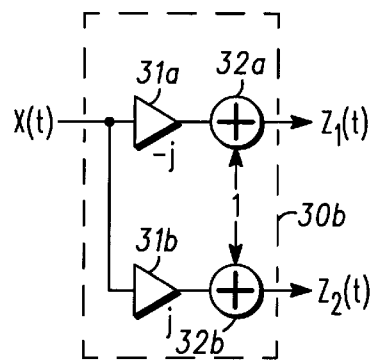
FIG. 4B illustrates a second embodiment of a truncated exponential module in accordance with the present invention.

Specifically, a truncated exponential module 30 of the illustrated embodiment 10a receives the complex modulated signal x(t), and in response thereto generate and provides a bandlimited exponential signal $z_1(t)$ and/or a bandlimited exponential signal $z_2(t)$. In a first embodiment 30a as shown in FIG. 4A, a gain amplifier 31a having a −j gain and an adder 32a generate and provide the bandlimited exponential signal $z_1(t)$ in accordance with the following equation [2a]:

$$z_1(t) = 1 + (-jx(t)) \quad [2a]$$

In a second embodiment 30b, a gain amplifier 31b having a j gain and an adder 32b additionally generate and provide the bandlimited exponential signal $Z_2(t)$ in accordance with the following equation [3a]:

$$z_2(t) = 1 + jx(t) \quad [3a]$$

The equations [2a] and [3a] are in accordance with a truncated Taylor series for an exponential which can more generally be written as the following equations [2b] and [3b], respectively:

$$z_1(t) = \sum_{k=0}^{K} \frac{(-jx(t))^k}{k!} \quad [2b]$$

$$z_2(t) = \sum_{k=0}^{K} \frac{(jx(t))^k}{k!} \quad [3b]$$

where K is a positive integer with K is preferably equaling 1. Since each term $(x(t))^k$ occupies a band $[kf_c-kB, kf_c+kB]$, where 2B is the bandwidth of x(t) and B is less than the carrier frequency $f_c$, by truncating the series we are effectively ideally low-pass filtering the exponential without computing the full exponential nor explicitly performing the filtering.

Figure 5A:
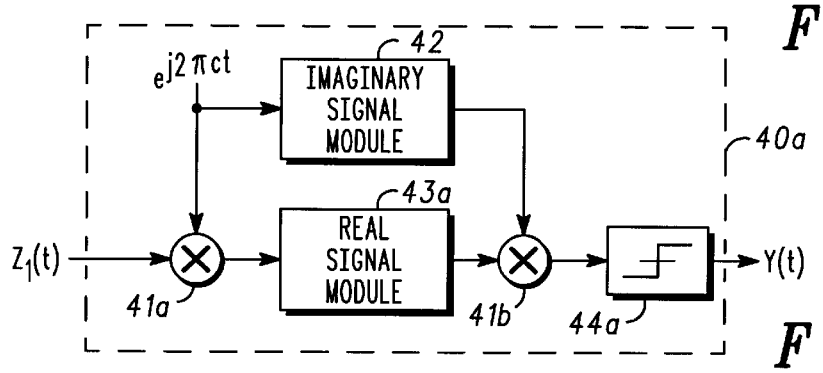
FIG. 5A illustrates a first embodiment of a pulse generator module in accordance with the present invention.

Referring again to the FIG. 2, a pulse generator module 40 of the signal generator 10 receives the bandlimited exponential signal $z_1(t)$ and/or the bandlimited exponential signal $z_2(t)$, and in response thereto, generates and provides the pulse modulated signal y(t). In a first embodiment 40a as shown in FIG. 5A, a mixer 41a, an imaginary module 42a, a real module 43a, a mixer 41b, and a slicer 44a generate and provide the pulse modulated signal y(t) in accordance with the following equation [4]:

$$y(t) = \mathrm{sgn}\ \mathrm{Re}\ z_1(t)e^{j2\pi ct} \times \mathrm{sgn}\ \sin(2\pi ct) = \mathrm{sgn}\ \mathrm{Im}\{z_r(t)\cos(2\pi ct) - z_i \sin(2\pi ct)\} \times \mathrm{sgn}\ \sin(2\pi ct) \quad [4]$$

where the imaginary module 42a conventionally extracts an imaginary component of $e^{j2\pi ct}$; the real module 43a conventionally extracts a real component of a product of the bandlimited exponential signal $z_1(t)$ and $e^{j2\pi ct}$; $z_r(t)$ is the real part of the bandlimited exponential signal $z_1(t)$; $z_i(t)$ is the imaginary part of the bandlimited exponential signal $z_1(t)$, and c is half the switching frequency of pulse modulated signal y(t).

Figure 5B:
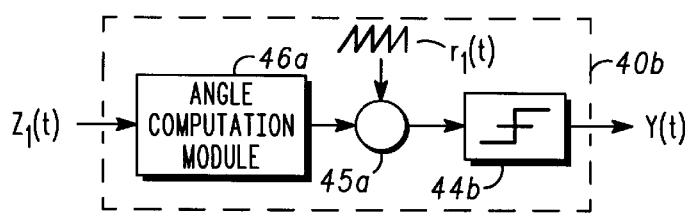
FIG. 5B illustrates a second embodiment of a pulse generator module accordance with the present invention.

In a second embodiment 40b as shown in FIG. 5B, the module 40 includes an angle computation module 46a, a summer 45a, and a slicer 44b, which generate and provide the pulse modulated signal y(t) in accordance with the following equation [5]:

$$y(t) = \mathrm{sgn}\{\angle z_1(t) - r_1(t)\} \quad [5]$$

where the angle computation module 46a conventionally computes the angle of the bandlimited exponential signal $zhd\ 1(t)$; and $r_1(t)$ is a ramp signal with a period $1/(2c)$.

Figure 5C:
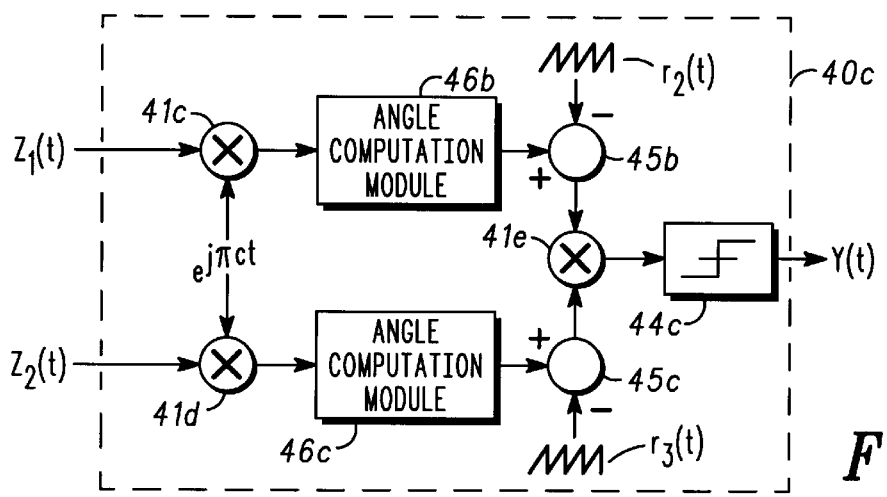
FIG. 5C illustrates a third embodiment of a pulse generator module in accordance with the present invention.

In a third embodiment 40c as shown in FIG. 5C, a mixer 41c, a mixer 41d, an angle computation module 46b, an angle computation module 46c, a summer 45b, a summer 45c, a mixer 41e, and a slicer 44c generate and provide the pulse modulated signal y(t) in accordance with the following equation [6]:

$$y(t) = \mathrm{sgn}\{\angle z_1(t) - r_2(t)\} \times \mathrm{sgn}\ \{\angle z_2 - r_3(t)\} \quad [6]$$

where the angle computation module 46b conventionally computes the angle of the bandlimited exponential signal $z_1(t)$; the imaginary module 46c conventionally computes the angle of the bandlimited exponential signal $z_2(t)$; and $r_2(t)$ and $r_3(t)$ are ramps each with period 1/c, preferably with a relative delay of $1/(2c)$.

Figure 6:
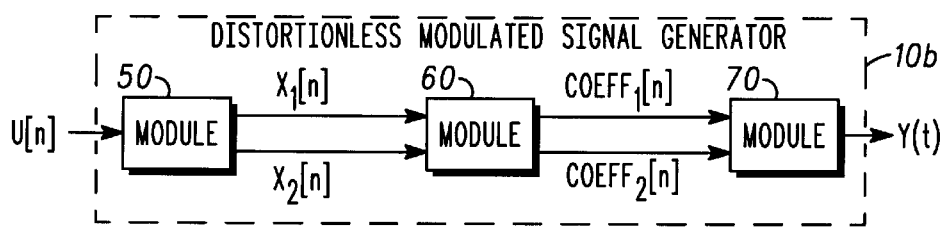
FIG. 6 illustrates a second embodiment of the distortionless pulse modulated signal generator of FIG. 1.
Figure 7A:
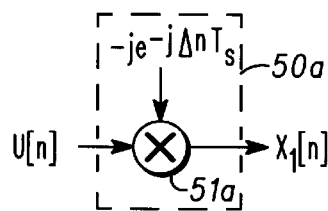
FIG. 7A illustrates a second embodiment of a frequency shift module in accordance with the present invention.

In FIG. 6, a second embodiment 10b of the signal generator 10 is shown. In the illustrated embodiment 10b, a complex frequency shift module 50 receives the complex baseband signal in digital form u[n] at a sample rate $T_s$, and in response thereto, generates and provides a complex modulated signal $x_1[n]$ and/or a complex modulated $x_2[n]$. In one embodiment 50a as shown in FIG. 7A, a mixer 51a generates and provides the complex modulated signal $x_1[n]$ in accordance with the following equation [7]:

$$x_1[n] = -ju[n]e^{-j\Delta nT_s} \quad [7]$$

where $\Delta = 2\pi c - 2\pi f_c$.

Figure 7B:
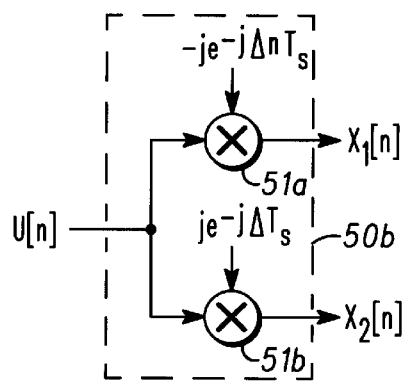
FIG. 7B illustrates a third embodiment of a frequency shift module in accordance with the present invention.

In a second embodiment 50b as shown in FIG. 7B, a mixer 51b additionally generates and provides the complex modulated signal $x_2[n]$ in accordance with the following equation [8]:

$$x_2[n] = ju[n]e^{-j\Delta nT_s} \quad [8]$$

Figure 8A:
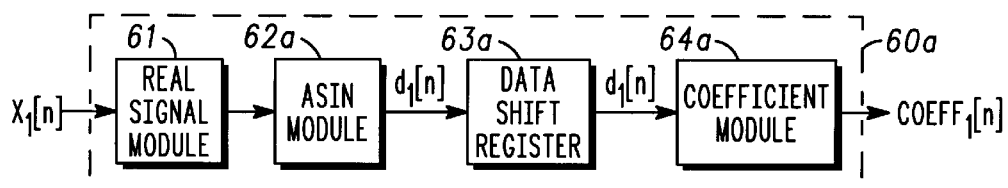
FIG. 8A illustrates a first embodiment of a coefficient computation module in accordance with the present invention.

Referring again to FIG. 6, a coefficient computation module 60 receives the complex modulated signal $x_1[n]$ and/or the complex modulated signal $x_2[n]$, and in response thereto, generates and provides a coefficient vector signal $coeff_1[n]$ and/or a coefficient vector signal $coeff_2[n]$. In one embodiment 60a as shown in FIG. 8A, a real signal module 61 and a asin module 62a compute a data signal $d_1[n]$ in accordance with the following equation [9]:

$$d_1[n] = \sin^{-1} \operatorname{Re} x_1[n] \quad [9]$$

where the real signal module 61 conventionally extracts the real part of the complex modulate signal $x_1[n]$.

A data shift register 63a conventionally buffers L samples of the signal $d_1[n]$, and a coefficient module 64a conventionally fits the L data samples to a polynomial of time to thereby generate and provide the coefficient signal vector $coeff_1[n]$. For example, if the data shift register 63a is of length L=3 and its contents are $d[n-2]$, $d[n-1]$, and $d[n]$, the coefficient signal vector $coeff_1[n]$ would be in accordance with the following equation [10]:

$$coeff_1[n] = \begin{matrix} d[n-1] \\ d[n] - d[n-2] \\ 2d[n-1] - d[n-2] - d[n] \end{matrix} \quad [10]$$

Figure 8B:
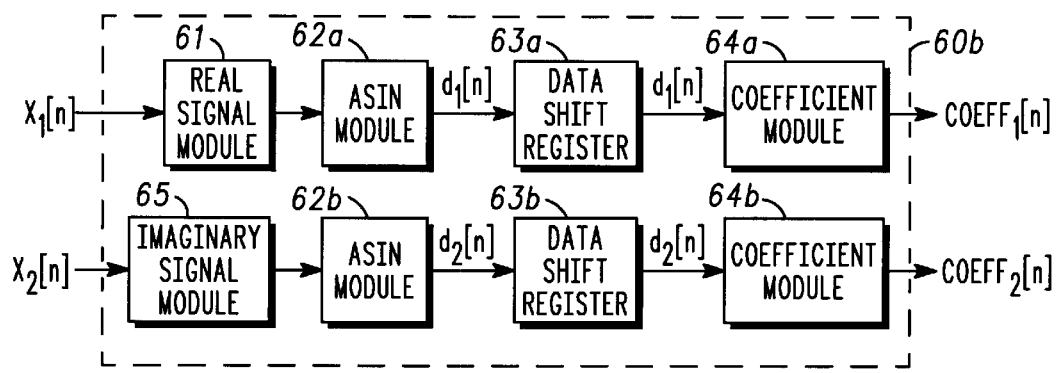
FIG. 8B illustrates a second embodiment of a coefficient computation module in accordance with the present invention.

In a second embodiment 60b as shown in FIG. 8B, an imaginary signal module 65 and an asin module 62b compute a data signal $d_2[n]$ in accordance with the following equation [11]:

$$d_2[n] = \sin^{-1} \operatorname{Im} x_1[n] \quad [11]$$

where the imaginary signal module 65 conventionally extracts the imaginary component of the complex modulate signal $x_1[n]$.

A data shift register 63b conventionally buffers L samples of the signal $d_2[n]$, and a coefficient module 64b conventionally fits the L data samples to a polynomial of time to thereby generate and provide the coefficient signal vector $coeff_2[n]$.

Figure 9A:
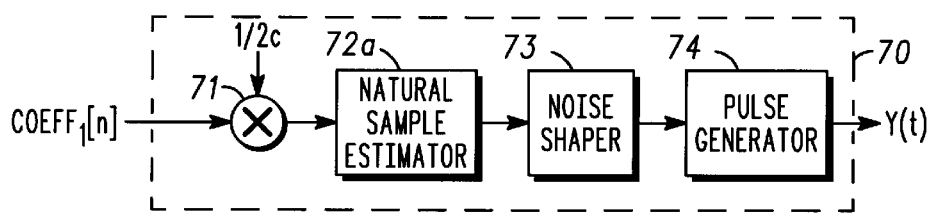
FIG. 9A illustrates a first embodiment of a natural sampling pulse generator module in accordance with the present invention.
Figure 9B:
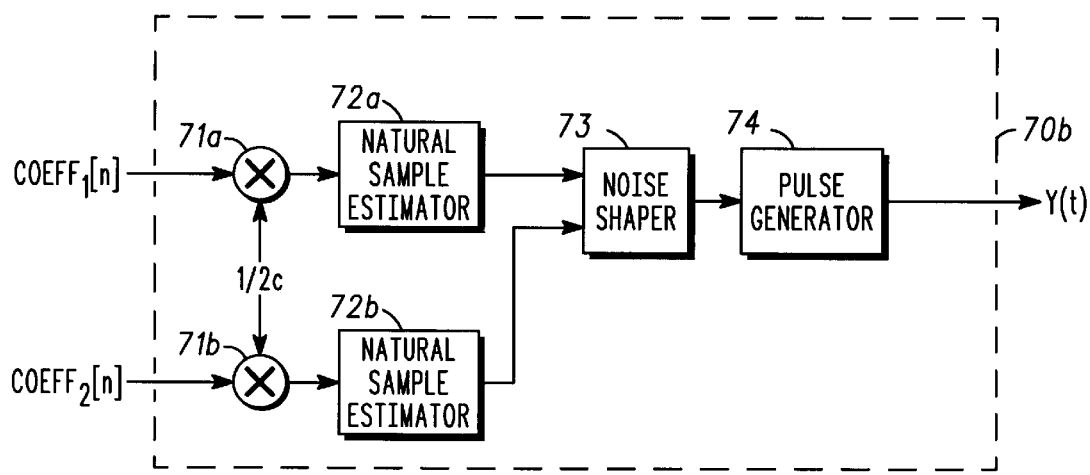
FIG. 9B illustrates a second embodiment of a natural sampling pulse generator module in accordance with the present invention.

Referring again to FIG. 6, a module 70 receives the coefficient signal vector $coeff_1[n]$ and/or coefficient signal vector $coeff_2[n]$, and in response thereto, generate and provides the pulse modulated signal y(t). In one embodiment 70a as shown in FIG. 9A, a mixer 71a, a natural sample estimator 72a, a noise shaper 73, and a pulse generator 74 for generating the pulse modulated signal y(t) in accordance with a natural sampled, noise shaped interpolation of the polynomial corresponding to the coefficient signal vector $coeff_1[n]$. In a second embodiment 70b as shown in FIG. 9B, a mixer 71b and a natural sample estimator 72b are additionally employed for generating the pulse modulated signal y(t) in accordance with a natural sampled, noise shaped interpolation of the polynomial corresponding to both the coefficient signal vector $coeff_1[n]$ and the coefficient signal vector $coeff_2[n]$.

The mixer 71a and the mixer 71b ensure that alternative transition times are complemented, which is a result of the modulated nature of the pulse modulated signal y(t). The natural sample estimators 72a and 72b can be based upon one of many conventional natural sampling techniques such as, for example, U.S. patent application Ser. No. 09/478,024 by Midya et al. The noise shaper 73 are preferably designed in accordance with a U.S. patent application Ser. No. 09/478,013 that was filed Jan. 5, 2000, and is entitled "APPARATUS FOR NOISE SHAPING A PULSE WIDTH MODULATION (PWM) SIGNAL AND METHOD THEREFOR", the entirety of which is hereby incorporated by reference. The pulse generator 74 can be based upon one of many conventional pulse generation techniques. The operational embodiments of the natural sample estimators 72a and 72b, the noise shaper 73, and the pulse generator 74, however, are predicated upon the operational requirements of a communication system or communication device including a signal generator in accordance with the present invention.

The illustrated embodiments of the present invention as well as other embodiments of the present invention may be implemented in hardware (analog or digital), software, or any combination of hardware and software. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A method, comprising:

receiving a complex baseband signal in analog form;

generating a complex modulated signal in response to a reception of the complex baseband signal, the complex modulated signal being a function of the complex baseband signal;

generating a first bandlimited exponential signal in response to a generation of the complex modulated signal, the first bandlimited exponential signal being a function of the complex modulated signal as computed with a first truncated series for an exponential; and generating a pulse modulated signal in response to a generation of the first bandlimited exponential signal, the pulse modulated signal being a function of the first bandlimited exponential signal.

2. The method of claim 1, further comprising:

generating a second bandlimited exponential signal in response to a generation of the complex baseband signal, the second bandlimited exponential being a function of the complex modulated signal as computed with a second truncated series for an exponential, wherein the pulse modulated signal is a function of the first bandlimited exponential signal and the second bandlimited exponential signal.

3. A method, comprising:

receiving a complex baseband signal in digital form;

generating a first complex modulated signal in response to a reception of the complex baseband signal, the first complex modulated signal being a function of the complex baseband signal;

generating a first coefficient vector in response to a generation of the complex baseband signal, the first coefficient vector being a function of the first complex modulated signal;

generating a pulse modulated signal in response to a generation of the first coefficient vector signal, the pulse modulated signal being a function of the first coefficient vector signal;

generating a second coefficient vector in response to a generation of the complex baseband signal, the second coefficient vector being a function of the first complex modulated signal; and wherein the pulse modulated signal is generated as a function of the first coefficient vector signal and the second coefficient vector.

4. The method of claim 3, further comprising:

generating a second complex modulated signal in response to a reception of the complex baseband signal, the second complex modulated signal being a function of the complex baseband signal; and generating a second coefficient vector in response to a generation of the complex baseband signal, the second coefficient vector being a function of the second complex modulated signal, wherein the pulse modulated signal is generated as a function of the first coefficient vector signal and the second coefficient vector.

5. A device, comprising:

means for receiving a complex baseband signal in analog form;

means for generating a complex modulated signal in response to a reception of the complex baseband signal, the complex modulated signal being a function of the complex baseband signal;

means for generating a first bandlimited exponential signal in response to a generation of the complex baseband signal, the first bandlimited exponential being a function of the complex modulated signal as computed with a first truncated series for an exponential; and means for generating a pulse modulated signal in response to a generation of the first bandlimited exponential signal, the pulse modulated signal being a function of the first bandlimited exponential signal.

6. The device of claim 5, further comprising:

means for generating a second bandlimited exponential signal in response to a generation of the complex baseband signal, the second bandlimited exponential being a function of the complex modulated signal as computed with a second truncated series for an exponential, wherein the pulse modulated signal is a function of the first bandlimited exponential signal and the second bandlimited exponential signal.

7. A device, comprising:

means for receiving a complex baseband signal in digital form; means for generating a first complex modulated signal in response to a reception of the complex baseband signal the first complex modulated signal being a function of the complex baseband signal;

means for generating a first coefficient vector in response to a generation of the complex baseband signal, the first coefficient vector being a function of the first complex modulated signal;

means for generating a pulse modulated signal in response to a generation of the first coefficient vector signal, the pulse modulated signal being a function of the first coefficient vector signal;

means for generating a second complex modulated signal in response to a reception of the complex baseband signal the second complex modulated signal being a function of the complex baseband signal; and means for generating a second coefficient vector in response to a generation of the complex baseband signal the second coefficient vector being a function of the second complex modulated signals; and wherein the pulse modulated signal is generated as a function of the first coefficient vector signal and the second coefficient vector.

8. The device of claim 7, further comprising:

means for generating a second coefficient vector in response to a generation of the complex baseband signal, the second coefficient vector being a function of the first complex modulated signal, wherein the pulse modulated signal is generated as a function of the first coefficient vector signal and the second coefficient vector.

9. A device, comprising:

an input operable to receive a complex baseband signal in analog form or in digital form; and an output operable to provide a pulse modulated signal in response to a reception of the complex baseband signal, the pulse modulated signal being a linear modulation of the complex baseband signal;

a first module operable to generate a complex modulated signal in response to a reception of the complex baseband signal by said device the complex modulated signal being a function of the complex baseband signal;

a second module operable to generate a first bandlimited exponential signal in response to a generation of the complex baseband signal, the first bandlimited exponential being a function of the complex modulated signal as computed with a first truncated series for an exponential; and a third module operable to generate a pulse modulated signal in response to a generation of the first bandlimited exponential signal, the pulse modulated signal being a function of the first bandlimited exponential signal.

10. The device of claim 9, wherein:

said second module is further operable to generate a second bandlimited exponential signal in response to a generation of the complex baseband signal, the second bandlimited exponential being a function of the complex modulated signal as computed with a second truncated series for an exponential; and said third module generates the pulse modulated signal as a function of the first bandlimited exponential signal and the second bandlimited exponential signal.

11. The device of claim 9, further comprising:

a first module operable to generate a first complex modulated signal in response to a reception of the complex baseband signal by said device, the first complex modulated signal being a function of the complex baseband signal;

a second module operable to generate a first coefficient vector in response to a generation of the complex baseband signal, the first coefficient vector being a function of the first complex modulated signal; and a third module operable to generate a pulse modulated signal in response to a generation of the first coefficient vector signal, the pulse modulated signal being a function of the first coefficient vector signal.

12. The device of claim 11, wherein:

said second module is further operable to generate a second coefficient vector in response to a generation of the complex baseband signal, the second coefficient vector being a function of the first complex modulated signal; and said third module generates the pulse modulated signal as a function of the first coefficient vector signal and the second coefficient vector.

13. The device of claim 11, wherein:

said first module is further operable to generate a second complex modulated signal in response to a reception of the complex baseband signal, the second complex modulated signal being a function of the complex baseband signal;

said second module is further operable to generate a second coefficient vector in response to a generation of the complex baseband signal, the second coefficient vector being a function of the second complex modulated signal; and said third module generates the pulse modulated signal as a function of the first coefficient vector signal and the second coefficient vector.

* * * * *